(12) United States Patent
Chou et al.

(10) Patent No.: US 7,432,194 B2
(45) Date of Patent: Oct. 7, 2008

(54) ETCHING METHOD AND METHOD FOR FORMING CONTACT OPENING

(75) Inventors: Pei-Yu Chou, Taipei County (TW); Jiunn-Hsiung Liao, Tainan County (TW)

(73) Assignee: United Microelectronics Corp., Hsinchu (TW)

( * ) Notice: Subject to any disclaimer, the term of this patent is extended or adjusted under 35 U.S.C. 154(b) by 277 days.

(21) Appl. No.: 11/160,131

(22) Filed: Jun. 10, 2005

(65) Prior Publication Data

US 2006/0281313 A1 Dec. 14, 2006

(51) Int. Cl.
*H01L 21/4763* (2006.01)

(52) U.S. Cl. .................. 438/636; 438/637; 438/725; 257/E21.038

(58) Field of Classification Search .................. 438/636, 438/637, 725
See application file for complete search history.

(56) References Cited

U.S. PATENT DOCUMENTS

2003/0003714 A1* 1/2003 Lee et al. ..................... 438/636
2006/0046495 A1* 3/2006 Frohberg et al. ............. 438/706

* cited by examiner

*Primary Examiner*—Alexander G Ghyka
(74) *Attorney, Agent, or Firm*—Jianq Chyun IP Office

(57) ABSTRACT

An etching method is described, including a first etching step and a second etching step. The temperature of the second etching step is higher than that of the first etching step, such that the after-etching-inspection (AEI) critical dimension is smaller than the after-development-inspection (ADI) critical dimension.

5 Claims, 3 Drawing Sheets

ETCHING METHOD AND METHOD FOR FORMING CONTACT OPENING

BACKGROUND OF THE INVENTION

1. Field of the Invention

The present invention relates to an etching method. More particularly, the present invention relates to an etching method capable of reducing critical dimension (CD), and to a method for forming a contact opening that utilizes the etching method.

2. Description of the Related Art

As the integration degree of IC is always required to be higher, the dimension of semiconductor devices unceasingly gets smaller. In the prior art, the miniaturization of pattern pitch in IC fabrication is mostly made by enhancing the lithographic resolution. However, high-resolution lithography techniques are more difficult and expensive due to the limitations of optics.

Instead of enhancing lithographic resolution, the critical dimension of pattern after etching can be reduced alternatively by modifying the etching process. In the modified etching method, a patterned photoresist layer with an after-development-inspection (ADI) critical dimension (CD) is formed with a conventional lithography process, and then a polymer-rich and low-power recipe is used to etch the target layer in a tapered manner so that the after-etching-inspection (AEI) CD is smaller than the ADI CD. However, since an opening in the photoresist layer and the anti-reflection coating (ARC) is easily expanded in such an etching method, the CD of the corresponding opening in the etched layer cannot meet the requirement. On the other hand, the above etching method has a limitation on the extent of CD reduction and may cause a striation effect, upon which the top-view profile of the openings is much changed so that adjacent openings overlap with each other to cause bridging between adjacent contact plugs. Therefore, the reliability of the devices is lowered.

SUMMARY OF THE INVENTION

In view of the foregoing, this invention provides an etching method that is capable of reducing the after-etching-inspection (AEI) CD.

Another object of this invention is to provide an etching method that is capable of reducing the critical dimension of patterns to increase the integration degree of IC.

Still another object of this invention is to provide a method for forming a contact opening, which is capable of preventing bridging between adjacent contact plugs to improve the reliability of semiconductor devices.

An etching method of this invention is described as follows. A semiconductor substrate is provided, on which a dielectric layer, an anti-reflection layer (ARC) and a patterned photoresist layer are formed sequentially. A first etching step is conducted using the patterned photoresist layer as a mask to remove at least the exposed ARC. A second etching step is then conducted using the patterned photoresist layer as a mask to remove a portion of the dielectric layer, and then the patterned photoresist layer is removed. The first and second etching steps are conducted at different temperatures.

According to an embodiment of this invention, the temperature of the first etching step is lower than that of the second etching step, preferably by about 5-20° C. The temperature of the first etching step is about 0-30° C., and that of the second etching step is about 30-50° C. Moreover, the first and second etching steps can be conducted in different etching chambers. In the first etching step, a polymer spacer can be formed on the sidewall of the patterned photoresist layer.

Another etching method of this invention is described below. A semiconductor substrate is provided, on which a dielectric layer, an anti-reflection layer (ARC) and a patterned photoresist layer are formed sequentially. A first etching step is conducted, using the patterned photoresist layer as a mask and using a first etching gas including a first fluorinated hydrocarbon compound, to remove at least the exposed ARC. A second etching step is then conducted, using the patterned photoresist layer as a mask and using a second etching gas including a second fluorinated hydrocarbon compound, to remove a portion of the dielectric layer, and then the patterned photoresist layer is removed. The hydrogen content in the first fluorinated hydrocarbon compound is lower than that in the second fluorinated hydrocarbon compound.

According to an embodiment of this invention, the first fluorinated hydrocarbon compound includes tetrafluoromethane ($CF_4$). The first etching gas may also include a mixed gas of octafluorobutene ($C_4F_8$) and hexafluorobutyne ($C_4F_6$), and may further include CO or $O_2$.

According to a preferred embodiment of this invention, the second etching step in the above etching method includes a main etching step and an over-etching step. The second fluorinated hydrocarbon compound used in the main etching step may include $CHF_3$ and $CH_2F_2$. The second etching gas used in the main etching step may also include $CH_3F$, and may further include argon (Ar) or $O_2$. The second fluorinated hydrocarbon compound used in the over-etching step may be hexafluorobutyne ($C_4F_6$), octafluoropentyne ($C_5F_8$) or octafluorobutene ($C_4F_8$), etc., and the second etching gas used in the over-etching step may further include $O_2$ or Ar.

According to an embodiment of this invention, the temperature of the first etching step is lower than that of the second etching step. The temperature of the first etching step is preferably lower than that of the second etching step by about 5-20° C. The temperature of the first etching step is about 0-30° C., and that of the second etching step is about 30-50° C. In addition, the first and the second etching steps may be conducted in different etching chambers. Moreover, in the first etching step, a polymer spacer can be formed on the sidewall of the patterned photoresist layer.

In the method for forming a contact opening of this invention, a substrate having a conductive region thereon is provided. A dielectric layer is formed over the substrate covering the conductive region, and then an ARC and a patterned photoresist layer are sequentially formed on the dielectric layer. A first etching step is conducted using the patterned photoresist layer as a mask to remove at least the exposed ARC. A second etching step is then conducted using the patterned photoresist layer as a mask to remove a portion of the dielectric layer and thereby expose at least a portion of the conductive region, and then the patterned photoresist layer is removed. The first and the second etching steps are conducted at different temperatures.

According to an embodiment, the temperature of the above first etching step is lower than that of the above second etching step, preferably by about 5-20° C. The temperature of the first etching step is about 0-30° C., and that of the second etching step is about 30-50° C.

According to a preferred embodiment, a first etching gas including a first fluorinated hydrocarbon compound is used as in the first etching step, and a second etching gas including a second fluorinated hydrocarbon compound is used in the second etching step. The hydrogen content in the first fluorinated hydrocarbon compound is lower than that in the second fluorinated hydrocarbon compound.

In the above embodiment, the first fluorinated hydrocarbon compound may include tetrafluoromethane (CF4). The first etching gas may also include a mixed gas of octafluorobutene (C4F8) and hexafluorobutyne (C4F6), and may further include CO or O2. The second etching step may include a main etching step and an over-etching step. The second fluorinated hydrocarbon compound used in the main etching step may include CHF3 and CH2F2. The second etching gas used in the main etching step may also include CH3F, and may further include argon (Ar) or O2. The fluorinated hydrocarbon compound used in the over-etching step may be hexafluorobutyne (C4F6), octafluoropentyne (C5F8) or octafluorobutene (C4F8), etc., and the second etching gas used in the over-etching step may further include O2 or Ar.

Moreover, the first etching step and the second etching step may be conducted in different etching chambers. Moreover, in the first etching step, a polymer spacer can be formed on the sidewall of the patterned photoresist layer.

According to an embodiment of this invention, the above method for forming a contact opening may further include a step of forming a metal silicide layer on the conductive region before the dielectric layer is formed. The material of the metal silicide layer may be nickel silicide, tungsten silicide or cobalt silicide, etc.

In addition, an etching stop layer may be formed before the dielectric layer is formed, while a portion of the etching stop layer is removed after the second etching step is conducted.

Moreover, the above method for forming a contact opening may further include a step of forming a hard mask layer on the dielectric layer before the ARC is formed, while a portion of the hard mask layer is also removed in the first etching step.

The etching method of this invention is capable of forming a protective layer on the top surface of the patterned photoresist layer and a spacer on the sidewall of the same, so that the photoresist loss in the etching steps can be reduced, and the opening expansion problem can be avoid so that the after-etching-inspection (AEI) CD is smaller than the after-development-inspection (ADI) CD. Therefore, the CD of the devices can be reduced effectively. It is particularly noted that adopting the etching method of this invention can also improve the etching selectivity effectively.

Since the method for forming a contact opening of this invention can prevent the opening expansion effect, adjacent contact openings will not overlap with each other to cause bridging between adjacent contact plugs. Therefore, the reliability of the devices can be improved.

It is to be understood that both the foregoing general description and the following detailed description are exemplary, and are intended to provide further explanation of the invention as claimed.

DESCRIPTION OF THE PREFERRED EMBODIMENTS

Figure 1A:
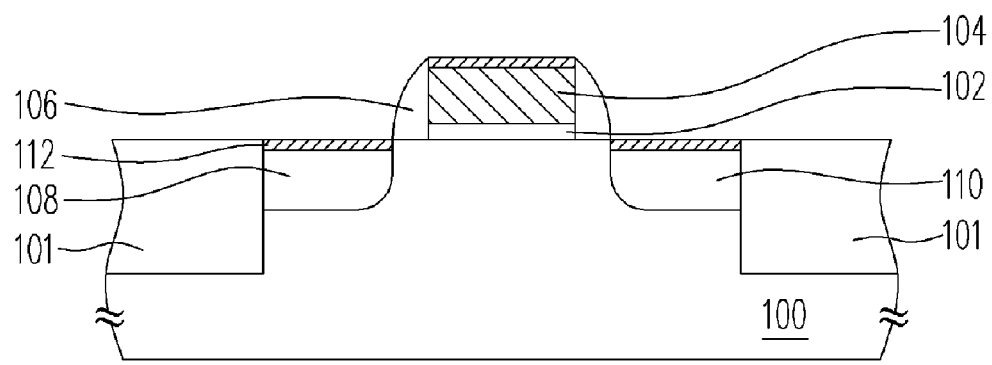
FIGS. 1A-1F illustrate a process flow of a method for forming a contact opening according to a preferred embodiment of this invention.

Referring to FIG. 1A, a semiconductor substrate 100 having a metal-oxide-semiconductor (MOS) device thereon is provided, wherein the MOS device is isolated from adjacent devices by an isolation structure 101 like a shallow-trench-isolation (STI) structure. In the MOS device, a gate 104 is formed on a gate dielectric layer 102, and a spacer 106 is formed on the sidewall of the gate 104. A source region 108 and a drain region 110 are formed in the substrate 100 beside the gate 104. In another embodiment, a metal suicide layer 112 is further formed on the gate 104, the source region 108 and the drain region 110 to reduce their resistance, wherein the material of the metal silicide layer 112 may be nickel silicide, tungsten silicide or cobalt silicide, etc. Because the material and forming method of each part in the above MOS device are known to one of ordinary skills, the description of them is omitted here.

Figure 1B:
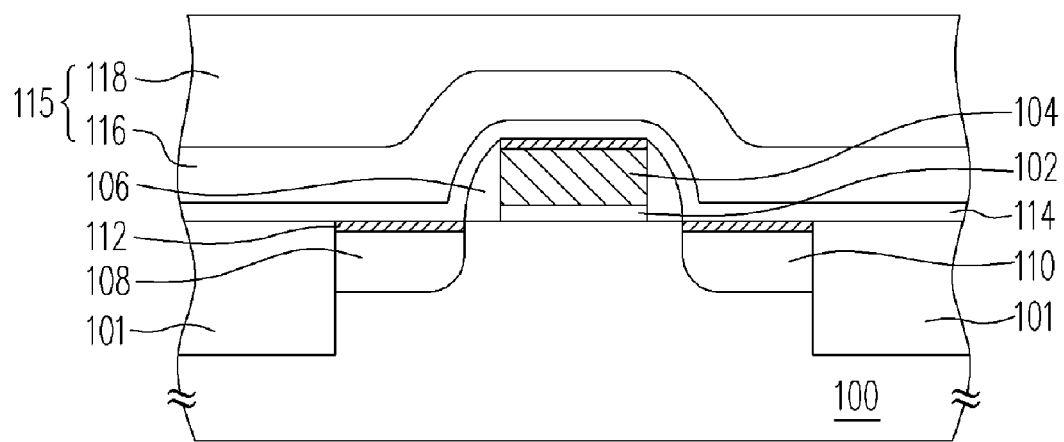

Referring to FIG. 1B, a dielectric layer 115 is formed on the substrate 100 covering the gate 104, the source region 108 and the drain region 110, wherein the dielectric layer 115 may include an undoped silicate glass (USG) layer 116 and a phosphosilicate glass (PSG) layer 118. Such a composite dielectric layer 115 can be formed by, for example, performing a CVD process to form a USG layer 116 and then performing another CVD process to form a PSG layer 118 on the USG layer 116. The USG layer 116 is capable of inhibiting the movement of phosphorous atoms from the PSG layer 118 to the gate 104, the source region 108 and the drain region 110, so that the electrical characteristics of the MOS device will not be affected. An etching stop layer 114 may be further formed before the dielectric layer 115 is formed. The material of the etching stop layer 114 may be silicon nitride, and the forming method of the same may be CVD. The etching stop layer 114 is formed to prevent the S/D junctions from being damaged due to the over-etching in the later contact process and thereby prevent a large leakage current.

Figure 1C:
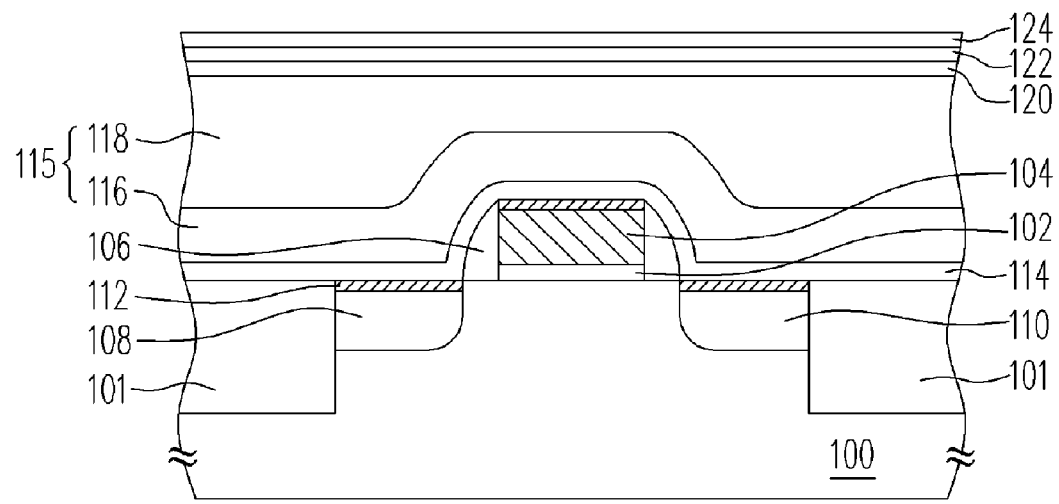

Referring to FIG. 1C, an anti-reflection coating (ARC) 124 is formed on the dielectric layer 118. The ARC 124 may include a Ti/TiN composite layer, and may be formed with CVD. In another embodiment, a hard mask layer 122 can be formed prior to the ARC 124. The hard mask layer 122 may include silicon oxynitride, and may be formed with CVD. The hard mask 122 is formed to serve as a mask layer protecting the underlying layers from being damaged when the patterned photoresist layer 126 is completely consumed during the etching process. Moreover, a cap layer 120 can be formed on the dielectric layer 115 before the hard mask 122 is formed. The material of the dielectric layer 115 may be silicon oxide, and the method for forming the same may be CVD with gaseous TEOS as a reaction gas.

Figure 1D:
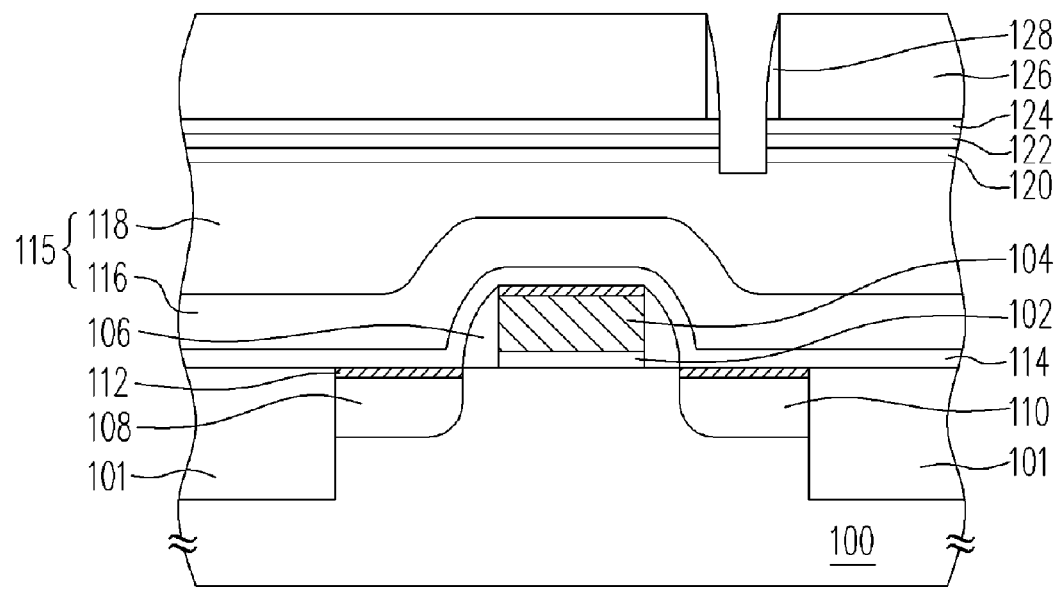

Referring to FIG. 1D, a patterned photoresist layer 126 is formed on the ARC 124, and then a first etching step is performed using the patterned photoresist layer 126 as a mask to remove at least the exposed ARC 124. The temperature range of the first etching step is preferably 0-30° C., and the etching gas used in the same includes a fluorinated hydrocarbon compound that may include CF4. The etching gas may also include a mixed gas of octafluorobutene (C4F8) and hexafluorobutyne (C4F6), and may further include CO or O2 according to the properties of the photoresist material. In another embodiment, the exposed ARC 124, the hard mask layer 122 and cap layer 120 under the exposed ARC 124, and a portion of the dielectric layer 115 is successively removed in the first etching step.

It is noted that in an embodiment of this invention, the active species generated from the above etching gas including a fluorinated hydrocarbon compound will react with the patterned photoresist layer 126 to form a polymer spacer 128 on the sidewall of the same. Thereby, expansion of the contact opening in the patterned photoresist layer 126 and the ARC 124 can be avoided, and the CD of the contact opening can be reduced. Therefore, the distance between two adjacent contact openings is increased so that bridging between adjacent contact plugs can be prevented. Consequently, the reliability of devices can be improved.

Figure 1E:
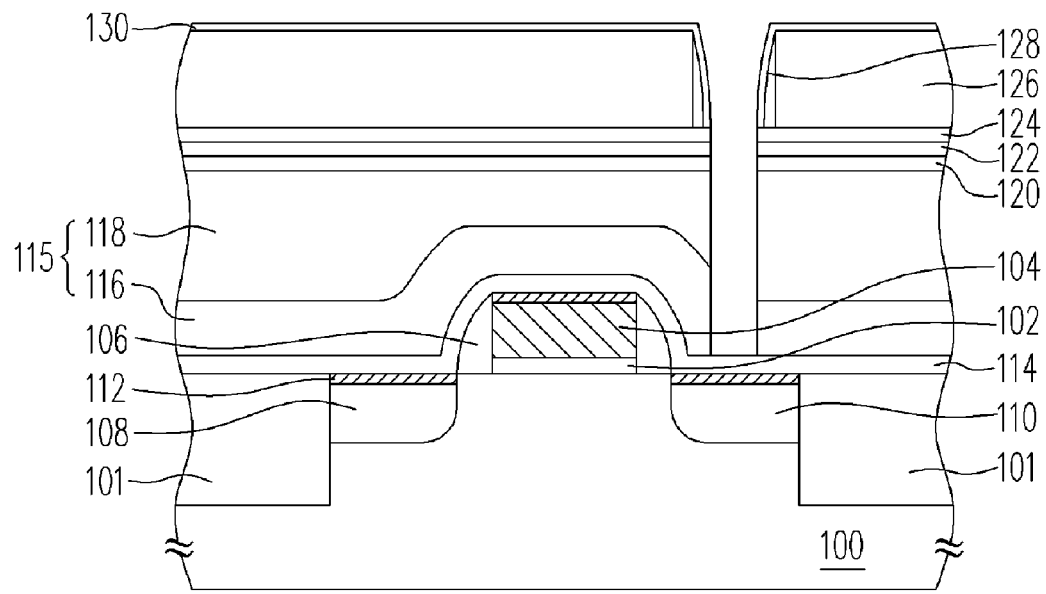

Referring to FIG. 1E, a second etching step is performed using the patterned photoresist layer 126, the ARC 124, the hard mask layer 122 and the cap layer 120 as a mask to remove a portion of the dielectric layer 115. The temperature of the second etching step is higher than that of the first etching step by, for example, 5-20° C., and is preferably 30-50° C. The etching gas used in the second etching step may include a fluorinated hydrocarbon compound to improve the etching selectivity effectively. In another embodiment, the hydrogen content in the fluorinated hydrocarbon compound used in the first etching step is lower than that in the fluorinated hydrocarbon compound used in the second etching step.

Moreover, the second etching step may include a main etching step and an over-etching step, wherein the main etching step removes at least the exposed PSG layer 118 with an etching gas including a fluorinated hydrocarbon compound like CHF3 and CH2F2, while CH3F may also be added in the etching gas. Moreover, the etching gas may further include Ar or O2 according to the properties of the photoresist material.

In the main etching step, the active species generated from the fluorinated hydrocarbon compound will react with the patterned photoresist layer 126 to deposit a polymer layer 130 uniformly on the top surface and the sidewall of the same. The polymer layer 130 is generally a short-chain polymer that can protect the photoresist layer 126 to reduce its loss in the etching step.

On the other hand, in the over-etching step that completely removes the residual USG layer 116 exposed by the patterned photoresist layer 126, the fluorinated hydrocarbon compound used may be hexafluorobutyne (C4F6), octafluoropentyne (C5F8) or octafluorobutene (C4F8), etc. The etching gas may further include Ar or O2 according to the properties of the photoresist material, such that the over-etching step can stop on the etching stop layer 1114.

In another embodiment, the first etching step and the second etching step mentioned above can be conducted in different reaction chambers because their operation temperatures are different.

Figure 1F:
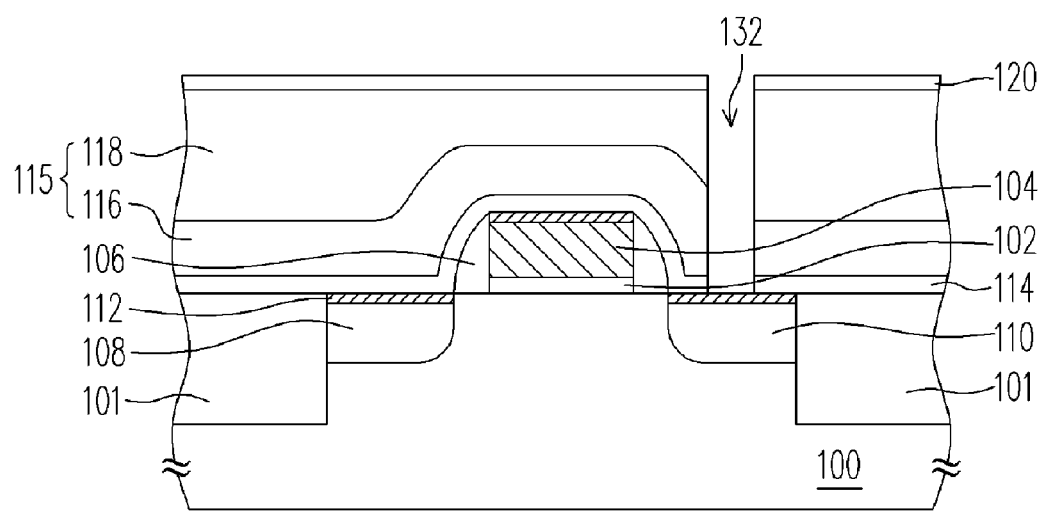

Referring to FIG. 1F, the polymer layer 130, the patterned photoresist layer 126 and the spacer 128 are removed using, for example, a dry etching method. The ARC 124 is then removed, possibly with dry etching. Next, a portion of the etching stop layer 114 is removed, possibly with a wet etching method like hot phosphoric acid treatment, to form a contact opening 132 exposing a portion of the metal silicide layer 112 on the drain region 110. In another embodiment, the hard mask layer 122 is removed together with the portion of the etching stop layer 114. The subsequent processes like the contact plug process and metal interconnect process are well known to one of ordinary skills, and are therefore not described here.

In the above embodiment, the first and the second etching steps are performed at different temperatures with different etching gases. That is, the present invention adjusts the temperature and the etching gas composition to reduce the AEI CD, to reduce the loss of the patterned photoresist layer 126, to prevent expansion of the opening in the patterned photoresist layer 126 and the ARC 124, and to improve the etching selectivity.

In summary, by using the etching method of this invention, the AEI CD can be made smaller than the ADI CD, so that the integration degree of devices can be increased. Moreover, polymer can be formed on the patterned photoresist layer in the etching process, so that the loss of the patterned photoresist layer can be reduced, and expansion of the opening in the patterned photoresist layer and the ARC can be prevented. Furthermore, the etching method of this invention has higher etching selectivity. In addition, since the CD of the contact openings formed with the method of this invention is smaller, bridging between adjacent contact plugs can be prevented more effectively to improve the reliability of the semiconductor devices.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. An etching method, comprising:
   providing a semiconductor substrate, on which a dielectric layer, an anti-reflection coating (ARC) and a patterned photoresist layer are formed sequentially;
   conducting a first etching step, with the patterned photoresist layer as a mask, to remove at least the ARC exposed by the patterned photoresist layer, wherein a temperature of the first etching step is about 0-30° C. and a polymer spacer is formed on a sidewall of the patterned photoresist layer in the first etching step;
   conducting a second etching step, with the patterned photoresist layer as a mask, to remove a portion of the dielectric layer; and
   removing the patterned photoresist layer,
   wherein the first and second etching steps are conducted at different temperatures.

2. The etching method of claim 1, wherein the temperature of the first etching step is lower than the temperature of the second etching step.

3. The etching method of claim 2, wherein the temperature of the first etching step is lower than the temperature of the second etching step by about 5-20° C.

4. The etching method of claim 3, wherein the temperature of the second etching step is about 30-50° C.

5. The etching method of claim 1, wherein the first and second etching steps are conducted in different etching chambers.

* * * * *